United States Patent [19]

Roy et al.

[11] 3,974,249
[45] Aug. 10, 1976

[54] METHOD FOR MANUFACTURING A TRANSPARENT CERAMIC BODY

[75] Inventors: Donald W. Roy; Franklin J. Stermole, both of Golden, Colo.

[73] Assignee: Coors Porcelain Company, Golden, Colo.

[22] Filed: Oct. 10, 1972

[21] Appl. No.: 296,420

Related U.S. Application Data

[63] Continuation-in-part of Ser. No. 72,846, Sept. 16, 1970, abandoned.

[52] U.S. Cl. ................................. 264/65; 264/66
[51] Int. Cl.² ...................... F27B 9/04; F27B 9/10
[58] Field of Search .................. 264/66, 65, 332; 106/62, 73.4, 65; 65/18

[56] References Cited
UNITED STATES PATENTS

| | | | |
|---|---|---|---|
| 3,026,210 | 3/1962 | Coble | 106/65 |
| 3,212,401 | 10/1965 | Navias | 106/62 |
| 3,530,209 | 9/1970 | Ho | 106/62 |
| 3,531,308 | 9/1970 | Bagley | 106/62 |
| 3,768,990 | 10/1973 | Sellers et al. | 106/62 |
| 3,862,846 | 1/1975 | Smoak et al. | 106/62 |

OTHER PUBLICATIONS

W. T. Bakker et al., "Reactor Magnesia Spinel, Preparation and Properties," Ceramic Bulletin, Nov. 1967, pp. 1094–1097.

P. E. Hart et al., "Densification Mechanisms in Hot Pressing of Magnesia with a Fugitive Liquid," Jour. Amer. Cer. Soc., Feb. '70 pp. 83–86.

*Primary Examiner*—Donald J. Arnold
*Attorney, Agent, or Firm*—Reising, Ethington, Barnard, Perry & Brooks

[57] ABSTRACT

The present invention provides a high heat resistant, light transmitting, thermal shock resistant and high strength sintered ceramic body containing at least about 98% by weight magnesia-alumina spinel and a method of manufacturing the same which comprises forming a uniform mixture containing approximately equal molar amounts of magnesia and alumina plus lithium fluoride in an amount of about 2% by weight of the mixture, the alumina in the mixture having an average particle size of less than 0.5 microns; calcining the mixture at such a temperature and under such conditions as will result in substantially less than total reaction to form spinel during calcining, i.e. less than 80% and preferably less than 50%; pressing the mixture into a self-sustaining compact having a density of at least about 2 grams per cubic centimeter; and then firing the compact, preferably in a wet hydrogen atmosphere, to a temperature of from about 1600° to 1900°C.

11 Claims, No Drawings

METHOD FOR MANUFACTURING A TRANSPARENT CERAMIC BODY

This patent application is a continuation-in-part of U.S. patent application Ser. No. 72,846, filed Sept. 16, 1970, now abandoned.

The present invention relates to an improved heat resistant transparent ceraminc body and method for manufacture thereof. More particularly, the invention relates to an improved ceramic body and method of manufacture wherein the body is of sintered magnesia-alumina spinel ($MgAl_2O_4$) and has excellent light transmission characteristics in both the visible and infrared regions of the electromagnetic spectrum. One of the significant advantages of the ceramic bodies of the present invention is their relatively low cost which is possible because their manufacture is accomplished without the requirement for a hot-pressing operation. The ceramic bodies of the present invention find utility as high strength, high temperature resistant windows for the transmission of visible and infrared light, as encapsulations for ionized alkali vapor lamps and other applications where there is a requirement for a material having transparency in combination with high heat resistance, mechanical strength and good resistance to thermal shock.

Accordingly, it is a principle object of the present invention to provide a ceramic body which has high temperature resistance, high mechanical strength, high resistance to thermal shock and good light transparency in both the visible and infrared wave length regions of the electromagnetic spectrum. A further and attendant object object the invention is the provision of a relatively low cost method for manufacturing such bodies without the requirement for a hot-pressing operation.

Briefly, the transparent ceramic bodies of the present invention are manufactured by cold pressing and then sintering a mixture containing approximately equal molar amounts of magnesia and alumina, said mixture having been precalcined in the presence of lithium fluoride under such conditions as will result in less than about 80% spinel formation during the calcining step. The magnesia and alumina in the precalcined mixture totally react during the sintering operation to form spinel whereby the final sintered body contains magnesia-alumina spinel in an amount in excess of 98% by weight. The mixture which is cold pressed may be formed by calcining, at a temperature of from about 800° to 1050°C, preferably from about 900° to about 950°C, in ambient atmosphere a mixture containing approximately equal molar amounts of magnesia and alumina together with a small amount, preferably about 2% by weight of the mixture, of lithium fluoride. The alumina used in the mixture should have a particle size of less than about 0.5 microns and ideally not in excess of 0.3 microns. The precise role played by the lithium fluoride is not presently known with certainty; however, what has been established is that when a mixture containing a small amount of lithium fluoride is calcined as aforesaid such that the magnesia and alumina do not totally react to form spinel, but instead are left to undergo substantial spinel-forming reaction during the subsequent sintering operation, the resultant final sintered bodies demonstrate greatly improved light transparency as well as other excellent physical properties. Other objects and important features and advantages of the invention will appear more clearly from the following more detailed description thereof.

PREPARATION OF THE MIXTURE

First, a mixture is made of approximately equal molar amounts of magnesia and alumina together wth lithium fluoride in an amount of about 2% by weight of the mixture. The amount of lithium fluoride included can vary from the amounts specified above, though it should not generally be less than about 0.2% or more than about 5% by weight of the mixture. The alumina should have an average particle size of less than 0.5 microns and preferably less than 0.3 microns. The ingredients used to form the mixture should preferably be free of water and, to this end, it is desirable to precalcine the magnesium oxide at about 500°C for from 1 to 4 hours to drive off surface water. To assure uniformity of the mixture, the ingredients are dry milled together, as in a conventional ball mill, for about 3 hours and then screened.

It will be appreciated by those skilled in this art that various grades of alumina and magnesia may be employed. Also, various salts of magnesia and alumina, which salts are converted to the oxide upon heating with the anion being driven off thus leaving no residue, may be substituted for all or part of the magnesia or alumina. Although a number of aluminas are suitable, we have found that those derived from ammonium alum such as Linde A or Ugine give best results for the purposes of this invention. We have also employed various grades of magnesia, including U.S.P. and reagent grade, with best results being obtaind when the U.S.P. magnesia is used. Among the salts which may be employed in place of magnesia or alumina are aluminum sulfate ($Al_2SO_4$), magnesium sulfate ($MgSO_4$) and magnesium carbonate ($MgCO_3$). However, best results are obtained when magnesia and alumina are used rather than salts thereof.

CALCINING

Next, the mixture is calcined in ordinary ambient atmosphere at a temperature from about 800° to 1050°C for from ½ to 5 hours, and more preferably at a temperature of about 900° to 950°C for about 3 hours. It is preferred, although not necessary, to press the mixture into a self-sustaining powder compact by a cold pressing operation prior to calcining. A pressure of about 15,000 psi is satisfactory for this pressing operation. The resulting powder compact is then calcined at the temperature and for the time described.

We have found that the calcining operation is a critical stage in the process of forming the improved heat resistant transparent ceramic bodies of this invention. We have found that for the manufacture of transparent spinel bodies it is necessary that the mixture be calcined under conditions which will result in less than total reaction to spinel during the calcining operation. Ideally we would prefer to calcine under conditions which result in substantially no spinel formation. Experimental data have shown that if the spinel reaction proceeds to greater than about 80% spinel formation during calcining, the transparency of the final product is reduced.

It will be appreciated by those skilled in this art that there are various parameters involved in determining optimal calcining conditions. Thus, the calcining temperature necessary is dependent upon the time of calcining, the types and grades of reactants, and the atmosphere in which calcining is carried out. Although the various parameters can be varied during the calcining operation, we have found that in the production of transparent spinel bodies, the best results are obtained, if the reactants are calcined at 800° to 1050°C, preferably 900° to 950°C as noted above, in normal ambient atmosphere for such a time as will result in substantially less than total reaction to form spinel. We have found by X-ray defraction studies that when calcining takes place in normal ambient atmosphere within the preferred temperature range of 900°–950°C for 1 to 3 hours the reaction to form spinel proceeds to less than 50%. The spinel body ultimately formed from these calcined reactants, it has been found, demonstrates superior transparency. However, products having good transparency have been produced also by using starting materials, i.e. alumina, magnesia, lithium fluoride, which have been calcined at 1025°C in normal ambient atmosphere. On the other hand, calcining at 1075°C results in excess spinel formation during calcining and, therefore, in a final product having poor transparency.

We have not dtermined with certainty what occurs during this critical calcining stage which ultimately aids in poducing a superior final product. However, we do believe that an advantage of the particular calcining procedure employed herein is that it provides a much more reactive system than would be obtained by conventional calcining techniques wherein substantially total spinel formation occurs. Although, the precise role played by lithium fluoride during calcining is not known, we believe that its use does have a significant effect on the reactivity of the calcined mixture, thereby making possible a faster reaction rate and, at least theoretically, more complete spinel formation during sintering. In any event, regardless of the reason therefor, we have found that by calcining in the presence of lithium fluoride under the conditions mentioned above such as will produce substantially less than total spinel formation, i.e. less than about 80% and preferably less than about 50%, we are able to produce a superior transparent spinel product.

MILLING AND DRY-PRESSING OPERATIONS

If, as is preferred, the initial mixture is pressed into a powder compact prior to the calcining operation, the mixture resulting from the calcining operation will be in the form of a calcined compact or billet. At the conclusion of the calcining operation the compact or billet is crushed to provide a mixture of relatively small particles. Of course, this crushing step is not necessary where the reactants have been calcined in powder form rather than in compact or billet form.

Particularly in the case wherein the reactants have been calcined in billet or compact form and subsequently crushed, it will be necessary to subsequently dry mill the crushed particles in order to break down agglomerates of the body components (alumina, magnesia, lithium fluoride, if any) and to thoroughly mix the same. In situations wherein the reactants have been calcined in powder form it is also preferable to dry mill to break down any agglomerates which may have formed during calcining.

Preparatory to dry milling it is preferable to add a small amount of organic lubricating material which acts as a grinding aid during the milling operation. Any of the various well-known organic lubricants useful in milling operations may be employed in amounts ranging from 2-5% by weight of the entire mixture; however, vegetable oils or animal fats are preferred. Of the animal fats about 3% by weight of neofat, which is chicken fat, is particularly preferred; and cotton seed oil is an example of a suitable vegetable oil. It will be appreciated by those skilled in the art that the lubricant should be such as will not react with the reaction components or otherwise adversely affect the same.

The particulate mixture is dry milled, with or without an organic lubricant, until the average particle size of the mixture is less than about 0.5 microns. Generally about 10 hours of dry milling in a conventional ball mill is sufficient.

The organic lubricant, although primarily useful during the grinding operation, also serves as a lubricant during the subsequent cold pressing operation, allowing the particles to slide one with respect to the other and thereby contribute to the attainment of high density in the green compact form. Thus, in those situations wherein a lubricating material is not employed, it is necessary to increase the pressure employed in the cold pressing operation to compensate for the absence of the lubricant and attain a sufficiently high green density.

Thus, the calcined particulate material, whether with or without an organic lubricant, is dry pressed to a self-sustaining green compact, of the shape desired, the pressure used being sufficient that the resulting compacts have a density of at least about 2 grams per cubic centimeter and preferably in excess of about 2.3 grams per cubic centimeter. Generally, the shape desired will be that of a flat plate and the pressing can be performed in conventional matched metal dies. A pressure of about 10,000 psi is generally satisfactory where the compact being pressed is a relatively thin plate as will usually be the case where the final bodies being manufactured are to be used as light transmitting windows. Since there is shrinkage, generally about 20%, during the sintering operation, the compact should be appropriately larger than the final sintered bodies desired.

SINTERING OPERATION

The compact is fired in a reducing atmosphere to cause substantially complete reaction of all the magnesia and alumina present to form spinel, and to sinter the spinel to a transparent dense body. The sintering and the spinel formation are all part and parcel of the total reaction and probably occur largely simultaneously rather than in complete step-wise fashion. The final firing should preferably be in a wet reducing atmosphere, a wet hydrogen atmosphere being ideal. The firing temperature should be at least 1600°C, and up to about 1900°C, with a substantial soak period or periods, at a temperature within this range. Though it will be understood that there can be variations in the temperature-time schedule, the following schedule in a wet hydrogen atmosphere is particularly excellent. Heat to 1800°C with a 100°C per hour temperature rise and soak 24 hours at that temperature. The moisture content in the wet hydrogen atmosphere may be varied over a wide range but room temperature dew points in the 30° to 60°F give fired parts with best transparency. Refiring parts under the same firing conditions or doubling the soak time significantly improves transmission.

In the case wherein a lubricant was present during cold pressing, the pressed powder compact, prior to the final firing or sintering operation, is first air fired at a temperature in the 1000° to 1300°C range for 1 to 5 hours to burn out the organic lubricant and start the initial sintering phase.

COMPOSITION AND PROPERTIES OF THE SINTERED BODIES

The sintered bodies resulting from the firing operation contain at least about 98% by weight magnesia-alumina spinel ($MgAl_2O_4$) and have a density of at least about 3.57 grams per cubic centimeter which is in excess of 99.5% of theoretical for the spinel. Light transmission measurements taken on the bodies, in the form of disks of 1.25 millimeter thickness, and after optical polishing thereof, show the transmission of visible light having a wavelength of 0.4 microns to be 68% and the transmission of visible light having a wavelength of 0.7 microns to be 72%. Applying Beer's Law and correcting to a one millimeter thickness, the transmission is 72% at 0.4 microns and 75% at 0.7 microns. Thus, transmission is in excess of 70 in the visible light region of the electromagnetic spectrum. The polished 1.25 millimeter thick disk also shows a transmission in excess of 80% in the infrared region (3 microns to 5 microns wavelength) of the electromagnetic spectrum.

The transparent, sintered ceramic bodies produced by the preferred method of this invention also exhibit the following properties:

| | |
|---|---|
| Melting Point | 2135°C |
| Knoop Hardness | 1300°C |
| Surface Finish, Polished | 1 microinch AA |
| 4-Point Bending Strength | 33,400 psi – 40,000 psi |
| Tensile Strength | 23,000 psi |
| Compression Strength | 390,000 psi |
| Modulus of Elasticity | $35 \times 10^6$ psi static |
| Shear Modulus | $15.89 \times 10^6$ psi dynamic |
| Bulk Modulus | $27.93 \times 10^6$ psi dynamic |
| Poisson's Ratio | 0.2608 |
| Coefficient of Linear Expansion | |
| 25–200°C | $5.6 \times 10^{-6}$/°C |
| 25–500°C | $7.3 \times 10^{-6}$/°C |
| 25–1000°C | $7.9 \times 10^{-6}$/°C |
| Thermal Conductivity, g-cal | |
| 100°C | 0.0357 |
| 1200°C | 0.0130 |
| Specific Heat, g-cal | |
| 20°C | 0.200 |
| 1040°C | 0.214 |
| Transmittance, .5–5 Microns | |
| (0.040″ – thick test specimen) | 70 – 80% |
| Index of Refraction | 1.71 |
| Dielectric Constant | |
| $10^3$Hz | 8.2 |
| $10^6$Hz | 8.2 |
| $9.3 \times 10^9$Hz | 8.3 |
| Dissipation Factor | |
| $10^3$Hz | 0.00003 |
| $10^6$Hz | 0.00002 |
| $9.3 \times 10^9$Hz | 0.000013 |
| Loss Index | |
| $10^3$Hz | 0.00025 |
| $10^6$Hz | 0.0002 |
| $9.3 \times 10^9$Hz | 0.0001 |

It will be understood that while the invention has been described specifically with reference to a preferred embodiment thereof, various changes and modifications may be made all within the full and intended scope of the claims which follow.

The embodiments of the invention in which an exclusive property or privilege is claimed are defined as follows:

1. A method for manufacturing a ceramic body comprising the steps of forming a uniform mixture containing approximately equal molar amounts of magnesia and alumina and from about 0.2% to 5% by weight lithium fluoride, the alumina in said mixture having a particle size of less than about 0.5 microns, calcining said mixture at a temperature of at least about 800°C for a time that there is less than about 80% reaction of the alumina and magnesia to form spinel, forming the calcined mixture into a self-sustaining compact and firing the compact in a reducing atmosphere to sintering temperature to cause the reaction of the magnesia and alumina in the calcined mixture to form spinel and thereby form a sintered body consisting predominately of magnesia-alumina spinel.

2. a method as set forth in claim 1 wherin the mixture is calcined at a temperature of at least about 800°C for a time that there is less than about 50% reaction of the alumina and magnesia to form spinel.

3. A method as set forth in claim 1, wherein mixture, after said calcining thereof, is milled in admixture with from about 2% to about 5% by weight of the mixture of an organic lubricant and wherein the mixture is formed into the self-sustaining compact by a pressing operation during which the organic lubricant remains in the mixture.

4. A method as set forth in claim 1, wherein said compact is fired in a wet reducing atmosphere to a temerature of from about 1600° to 1900°C.

5. A method as set forth in claim 1, wherein the compact is fired by first heating it to a temperature of from about 1000°C to about 1300°C in an oxidizing atmosphere and is then heated in a wet reducing atmosphere to a temperature of about 1800°C with a soak at that temperature of about 24 hours.

6. A method as set forth in claim 1, wherein the amount of lithium fluoride included in said mixture is approximately 2% by weight of the mixture.

7. A method as set forth in claim 1, wherein the aluminum oxide in the mixture wich is calcined has an average particle size of less than about 0.3 microns.

8. A method as set forth in claim 1, wherein said compact is formed so as to have a density greater than 2 grams per cubic centimeter.

9. A method as set forth in claim 1, wherein said mixture, prior to the calcining step, is formed into a self-sustaining compact and wherein said compact, after said calcining step is crushed and thereafter milled to a reduced particle size after from about 2% to about 5% by weight of the mixture of an organic lubricant has been added thereto.

10. A method as set forth in claim 1 wherein said mixture is calcined at a temperature of from about 800° to 1050°C.

11. A method as set forth in claim 1 wherein said mixture is calcined at a temperature of from about 900°C to 950°C for approximately 3 hours.

* * * * *